United States Patent
Rowland et al.

(10) Patent No.: US 10,522,889 B2
(45) Date of Patent: Dec. 31, 2019

(54) TUNABLE PASSIVE ENHANCE Q MICROWAVE NOTCH FILTER

(71) Applicant: SPAWAR Systems Center Pacific, San Diego, CA (US)

(72) Inventors: Jason F. Rowland, San Diego, CA (US); Jia-Chi S. Chieh, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 52 days.

(21) Appl. No.: 15/947,906

(22) Filed: Apr. 9, 2018

(65) Prior Publication Data

US 2019/0312560 A1    Oct. 10, 2019

(51) Int. Cl.
 H01P 1/203   (2006.01)
 H01P 3/08    (2006.01)
 H03H 7/01    (2006.01)

(52) U.S. Cl.
 CPC ............... *H01P 1/203* (2013.01); *H01P 3/08* (2013.01); *H03H 7/01* (2013.01); *H03H 7/0115* (2013.01); *H03H 2007/013* (2013.01); *H03H 2210/012* (2013.01)

(58) Field of Classification Search
 CPC ..... H01P 1/203; H01P 3/08; H03H 2007/013; H03H 7/12; H03H 7/0115
 USPC ............................. 333/175, 176, 204, 205
 See application file for complete search history.

(56) References Cited

U.S. PATENT DOCUMENTS

| | | | |
|---|---|---|---|
| 4,603,311 A | * | 7/1986 | Mage ............... H01P 1/203 333/202 |
| 7,323,955 B2 | | 1/2008 | Jachowski |
| 8,013,690 B2 | | 9/2011 | Miyashiro |
| 8,305,164 B1 | | 11/2012 | Jachowski |
| 8,390,745 B2 | | 3/2013 | Robert et al. |
| 8,912,868 B1 | | 12/2014 | Guyette |

(Continued)

OTHER PUBLICATIONS

Jachowski, "Passive enhancement of resonator Q in microwave notch filters," IEEE MTT-S In. Microw. Symp. Dig., 2004, pp. 1315-1318.

(Continued)

*Primary Examiner* — Rakesh B Patel
(74) *Attorney, Agent, or Firm* — Naval Information Warfare Center, Pacific; Kyle Eppele

(57) ABSTRACT

A tunable notch filter comprising a transmission line, a tunable bandstop filter and a tunable bandpass filter. The transmission line has an input port, an output port and a length electrically connecting the input port to the output port and receiving an RF signal at the input port. The tunable bandstop filter comprises a first direct current voltage source, a first coupling line and a first tunable capacitor. The first direct current voltage source provides a first adjustable voltage to the first tunable capacitor. The first tunable capacitor adjusts its capacitance based on the first adjustable voltage. The tunable bandpass filter comprises a second direct current voltage source, a second coupling line and a second tunable capacitor. The second direct current voltage source provides a second adjustable voltage to second tunable capacitor. The second tunable capacitor adjusts its capacitance based on the second adjustable voltage.

14 Claims, 6 Drawing Sheets

(56) References Cited

U.S. PATENT DOCUMENTS

| | | | |
|---|---|---|---|
| 8,928,431 B2 | 1/2015 | Koechlin | |
| 8,981,873 B2 | 3/2015 | Koechlin | |
| 10,097,153 B1* | 10/2018 | Rowland | H03H 7/07 |
| 2016/0269042 A1* | 9/2016 | Jabbour | H03M 3/462 |

OTHER PUBLICATIONS

Jachowski, "Compact frequency-agile, absorptive bandstop filters," IEEE MTT-S Micro. Symp. Dig. 2005, pp. 513-516.

Guyette et al., "Perfectly-matched bandstop filters using lossy resonators," 2005 IEEE MTT-S Int. Microwave Symp. Dig., Jun. 2005.

Jachowski, "Tunable lumped-element notch filter with constant bandwidth," IEEE Int Wireless Inf. Technol. Syst. Conf. 2010, pp. 1-4.

Lee et al., "Octave tunable lumped-element notch filter with resonator-Q-independent zero coefficient," IEEE MTT-S Int. Microw. Symp. Dig., 2014 pp. 1-4.

Morgan et al., "Theoretical and experimental study of a new class of reflective loss filter," IEEE Trans. Microw. Theory Tech., vol. 59, nol. 5. pp. 1214-1221, May 2011.

Lee et al., "Lumped-element realization of absorptive bandstop filter with anomalously high spectral isolation," IEEE TMTT, vol. 60, No. 8, pp. 2424-2430, Aug. 2012.

Kim et al., "RM CMOS integrated on-chip tunable absorptive bandstop filter using Qtunable resonators," IEEE TED, vol. 60, No. 5, pp. 1730-1737, May 2013.

C. Rauscher, "Varactor-tuned active notch filter with low passband noise and signal distortion," IEEE TMTT, vol. 49, No. 8, pp. 1431-1437.

* cited by examiner

TUNABLE PASSIVE ENHANCE Q MICROWAVE NOTCH FILTER

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 71720, San Diego, Calif., 92152; telephone (619) 553-5118; email: ssc_pac_t2@navy.mil. Reference Navy Case No. 104,005.

BACKGROUND OF THE INVENTION

Embodiments of the invention relate to a tunable notch filter.

Wideband radio receivers are often used in advanced communications systems. Wideband receivers allow for operational agility but are often susceptible to being jammed by a strong interferer. Notch filters are used to remove these strong interfering signals, which often comprise single frequencies. Prior-art notch filters, in many cases, suffer from compromises with respect to tunability, quality factor, or ease of manufacturing.

There exists a need for a tunable notch filter that can simultaneously address these characteristics.

SUMMARY OF THE INVENTION

An aspect of the present invention is drawn to a tunable notch filter comprising a transmission line, a tunable bandstop filter and a tunable bandpass filter. The transmission line has an input port, an output port and a length electrically connecting the input port to the output port. The transmission line is operable to receive an RF signal at the input port. The length has a first portion, a second portion and a third portion. The second portion is disposed between the first portion and the third portion. The tunable bandstop filter comprises a first direct current voltage source, a first coupling line and a first tunable capacitor. The first direct current voltage source is operable to provide a first adjustable voltage to the first tunable capacitor. The first tunable capacitor is operable to adjust its capacitance based on the first adjustable voltage. The tunable bandpass filter comprises a second direct current voltage source, a second coupling line and a second tunable capacitor. The second direct current voltage source is operable to provide a second adjustable voltage to second tunable capacitor. The second tunable capacitor is operable to adjust its capacitance based on the second adjustable voltage. The tunable bandpass filter and the transmission line are arranged such that the second coupling line is operable to couple a first portion of the RF signal from the first portion of the length and such that the first portion of the length transmits a second portion of the RF signal to the second portion of the length. The tunable bandstop filter and the transmission line are arranged such that the first coupling line is operable to couple, to ground, a third portion of the RF signal as provided by the first portion of the length line at the second portion of the length and such that the second portion of the length transmits a fourth portion of the RF signal to the third portion of the length. The tunable bandpass filter and the transmission line are further arranged such that the second coupling line is further operable to couple the passed portion of the first portion of the RF signal to the third portion of the length.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Wideband receivers are becoming more popular in radio-frequency communications systems due to their flexibility and ability to perform multiple functions. Because they operate over a wide range of frequencies, wideband receivers are more susceptible to blocking or jamming from a strong interferer. Various methods to mitigate interference have been employed, and these methods include limiters, channelizers, and notch filters.

A notch filter is characterized by a high level of rejection over a narrow bandwidth. A tunable notch filter can vary the frequency at which the notch is centered; this improves the ability to precisely excise undesirable signals. A notch filter should also be absorptive—that is, it should not reflect the rejected signal back through its input. Finally, tunable notch filters should also be scalable to high frequencies and be easy to manufacture. Prior-art tunable notch filters have difficulties achieving all of these characteristics simultaneously.

Aspects of the present invention provide for a tunable notch filter that can operate at high frequencies, is tunable across a wide band, has a high Q factor, is absorptive, and is easy to manufacture, and will now be discussed with reference to FIGS. 1-4.

Figure 1:
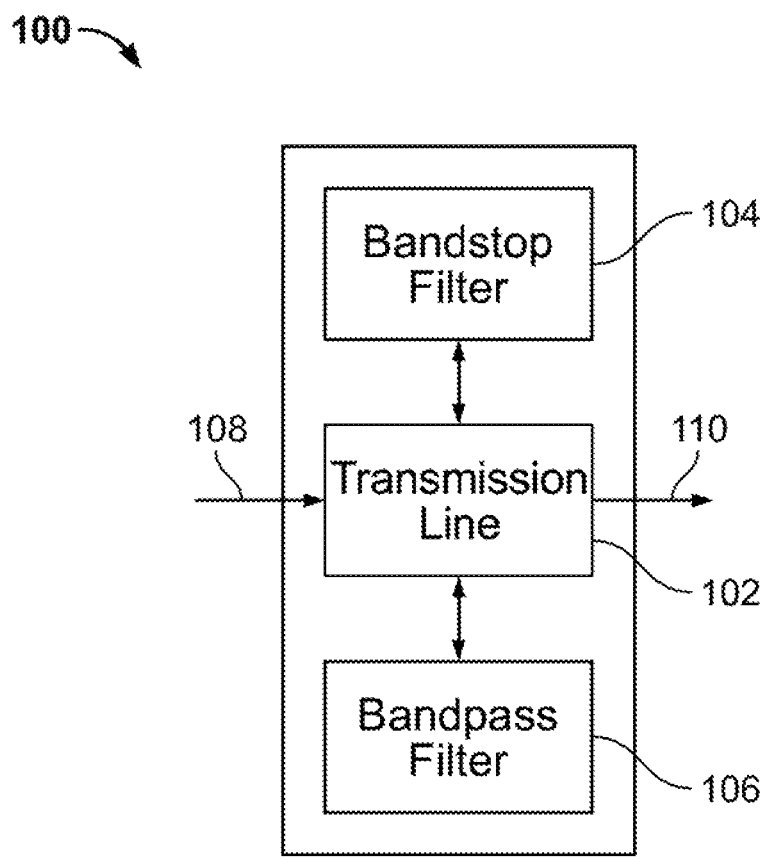
FIG. 1 illustrates a block diagram of a tunable notch filter in accordance with aspects of the present invention.

FIG. 1 illustrates a block diagram of filter 100 in accordance with aspects of the present invention.

As shown in the figure, filter 100 includes a transmission line 102, a tunable bandstop filter 104, and a tunable bandpass filter 106.

An input signal 108 enters filter 100 and an output signal 110 exits filter 100. Input signal 108 is any radio frequency signal provided to filter 100. Output signal 110 is the resulting radio frequency signal after being filtered by filter 100. In this non-limiting example, input signal 108 may be provided by an antenna.

Transmission line 102 may be any device that can convey a radio frequency signal over a specific distance. In this non-limiting example, transmission line 102 is a microstrip.

Tunable bandstop filter 104 may be any device or system that rejects signals around a specific center frequency and passes all other frequencies. Being tunable, the center frequency may be varied over time.

Tunable bandpass filter 106 may be any device or system that passes signals around a specific center frequency and rejects all other frequencies. Being tunable, the center frequency may be varied over time.

In operation, tunable bandstop filter 104 and tunable bandpass filter 106 are tuned to the same center frequency. Tunable bandstop filter 104 and tunable bandpass filter 106 are further tuned so that their bandpass amplitudes and notch depths are identical. Tunable bandstop filter 104 and tunable bandpass filter 106 are further disposed such that their outputs are one hundred eighty degrees (180°) out of phase, thereby effecting a deep cancellation of input signal 108 around the chosen center frequency.

FIG. 1 illustrates a block diagram of filter 100. Aspects of filter 100 will now be discussed with reference to FIGS. 2-7.

Figure 2:
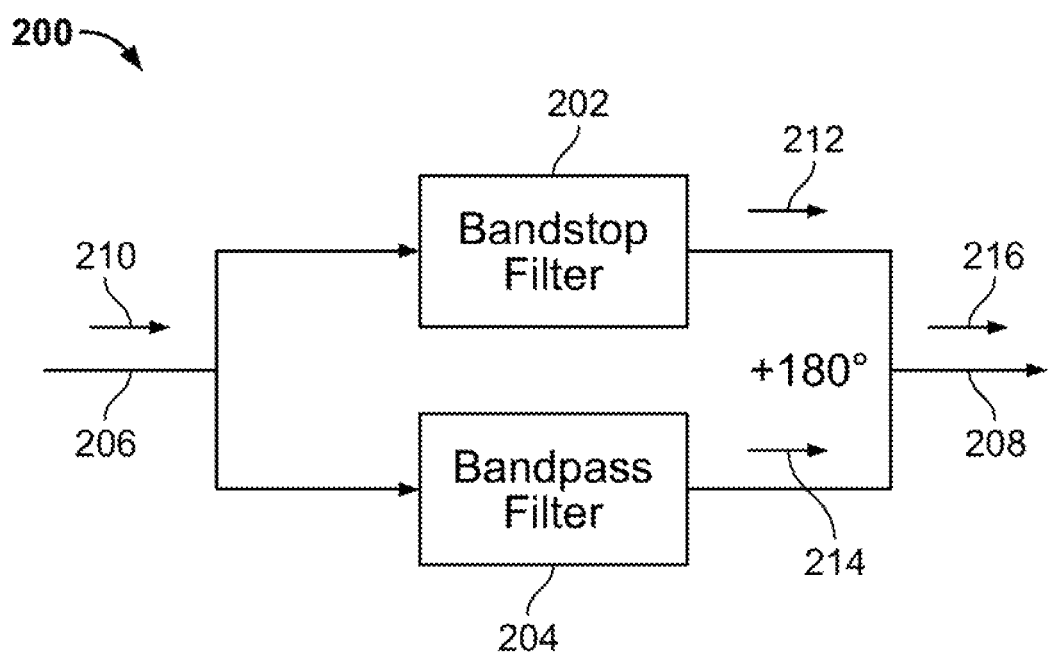
FIG. 2 illustrates a passive two-path distributed-element notch filter concept.

FIG. 2 illustrates a passive two-path distributed-element notch filter 200.

As shown in the figure, passive two-path distributed-element notch filter 200 includes a bandstop filter 202, a bandpass filter 204, an input 206 and an output 208.

Bandstop filter 202 is arranged to receive an input signal 210 from input 206 and to output a bandstop-filtered signal 212 to output 208. Bandpass filter 204 is arranged to receive input signal 210 from input 206 and to output a bandpass-filtered signal 214 to output 208. Output 208 provides an output signal 216 corresponding to the composition of bandstop-filtered signal 212 and bandpass-filtered signal 214.

Bandpass filter 204 is operable to pass a band of frequencies centered about a predetermined frequency $f_0$, and to block frequencies outside the band of frequencies. Bandstop filter 202 is operable to (ideally) block all frequencies, with the exception of the predetermined frequency $f_0$. The frequency response for bandstop filter 202 and bandpass filter 204 will now be described with reference to FIG. 3.

Figure 3:
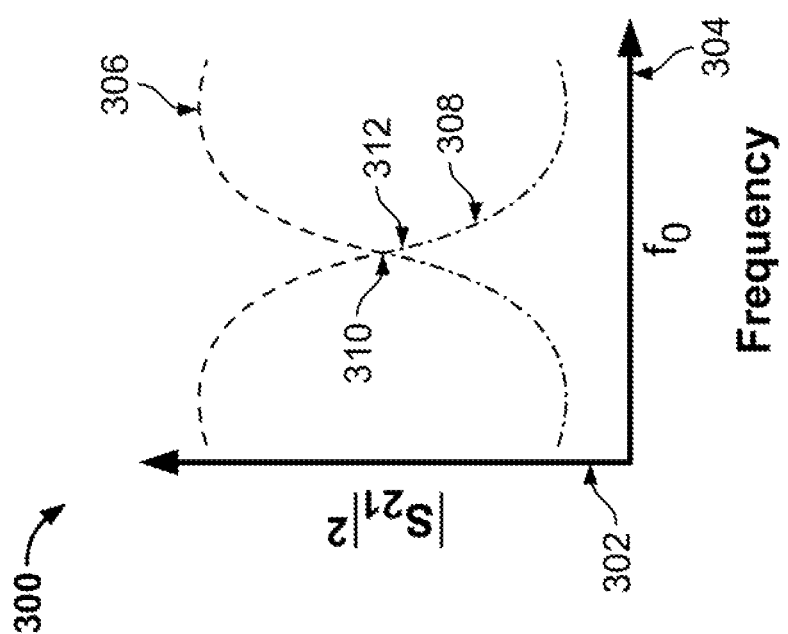
FIG. 3 illustrates input signal response for each path of the passive two-path distributed-element notch filter concept of FIG. 2.

FIG. 3 illustrates a frequency response for each path of the passive two-path distributed-element notch filter concept of FIG. 2.

FIG. 3 includes a graph 300 having a y-axis 302, an x-axis 304, a function 306 and a function 308. Function 306 includes minimum cusp 310, whereas function 308 includes a maximum cusp 312.

Y-axis 302 corresponds to the gain measured at output 208 of bandstop filter 202 and bandpass filter 204 of passive two-path distributed-element notch filter 200 of FIG. 2. X-axis 304 corresponds to the frequency of input signal 210 of passive two-path distributed-element notch filter 200 of FIG. 2.

Function 306 corresponds to the frequency response function of bandstop filter 202 of passive two-path distributed-element notch filter 200 of FIG. 2 as centered on frequency $f_0$. Here, bandstop filter 202 greatly attenuates frequency $f_0$ as shown by minimum cusp 310.

Function 308 corresponds to the frequency response function of bandpass filter 204 of passive two-path distributed-element notch filter 200 of FIG. 2 as centered on frequency $f_0$. Here, bandpass filter 204 greatly attenuates other frequencies outside of a band centered on frequency $f_0$ as shown by maximum cusp 312.

Returning to FIG. 2, in operation, a portion of input signal 210 is coupled through bandstop filter 202 to output 208 as bandstop-filtered signal 212. Further, the remaining portion of input signal 210 is coupled through bandpass filter 204 to output 208 as bandpass-filtered signal 214. Passive two-path distributed-element notch filter 200 is arranged such that at frequency $f_0$, the two portions of the signal arriving at the output 208 are of the same magnitude but 180° out of phase with each other. With this arrangement, at frequency $f_0$, bandstop-filtered signal 212 and bandpass-filtered signal 214 will cancel each other out. This is illustrated in FIG. 4.

Figure 4:
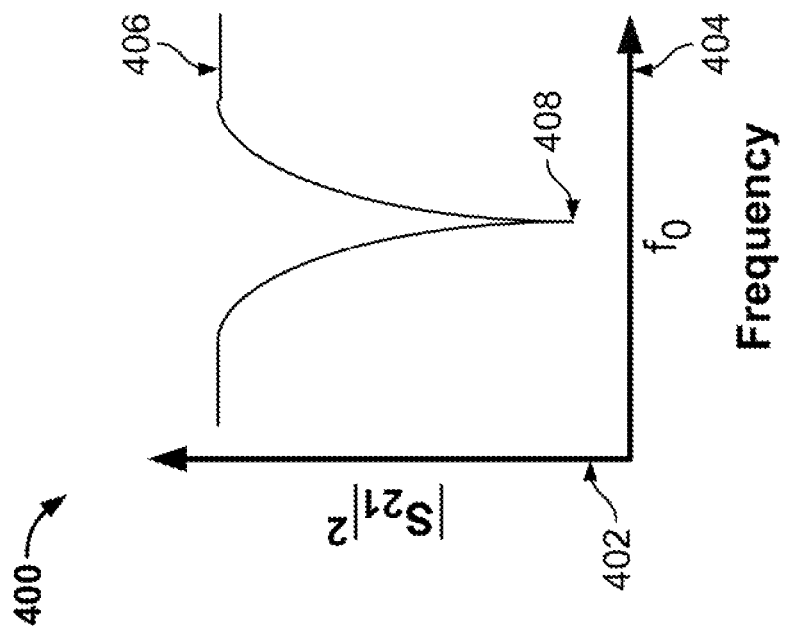
FIG. 4 illustrates an output signal response of the passive two-path distributed-element notch filter concept of FIG. 2.

FIG. 4 illustrates an output signal response of the passive two-path distributed-element notch filter concept of FIG. 2.

FIG. 4 includes a graph 400 having a y-axis 402, an x-axis 404 and a function 406. Function 406 includes minimum cusp 408.

Y-axis 402 corresponds to the gain of output signal 216 measured at output 208 as compared to the input 206 of passive two-path distributed-element notch filter 200 of FIG. 2. X-axis 404 corresponds to the frequency of input signal 210 of passive two-path distributed-element notch filter 200 of FIG. 2.

As shown in FIG. 3, at frequency $f_0$, bandstop-filtered signal 212 and bandpass-filtered signal 214 have the same magnitude. As shown in FIG. 4, since bandstop-filtered signal 212 and bandpass-filtered signal 214 are 180° out of phase, there is a maximum attenuation at $f_0$ as indicated at minimum cusp 408. It is this feature that provides an efficient bandstop filter in accordance with the present invention. Further, the tunable filters enable a tunable efficient bandstop filter, which will be described in greater detail with reference to FIGS. 5-7.

Figure 5:
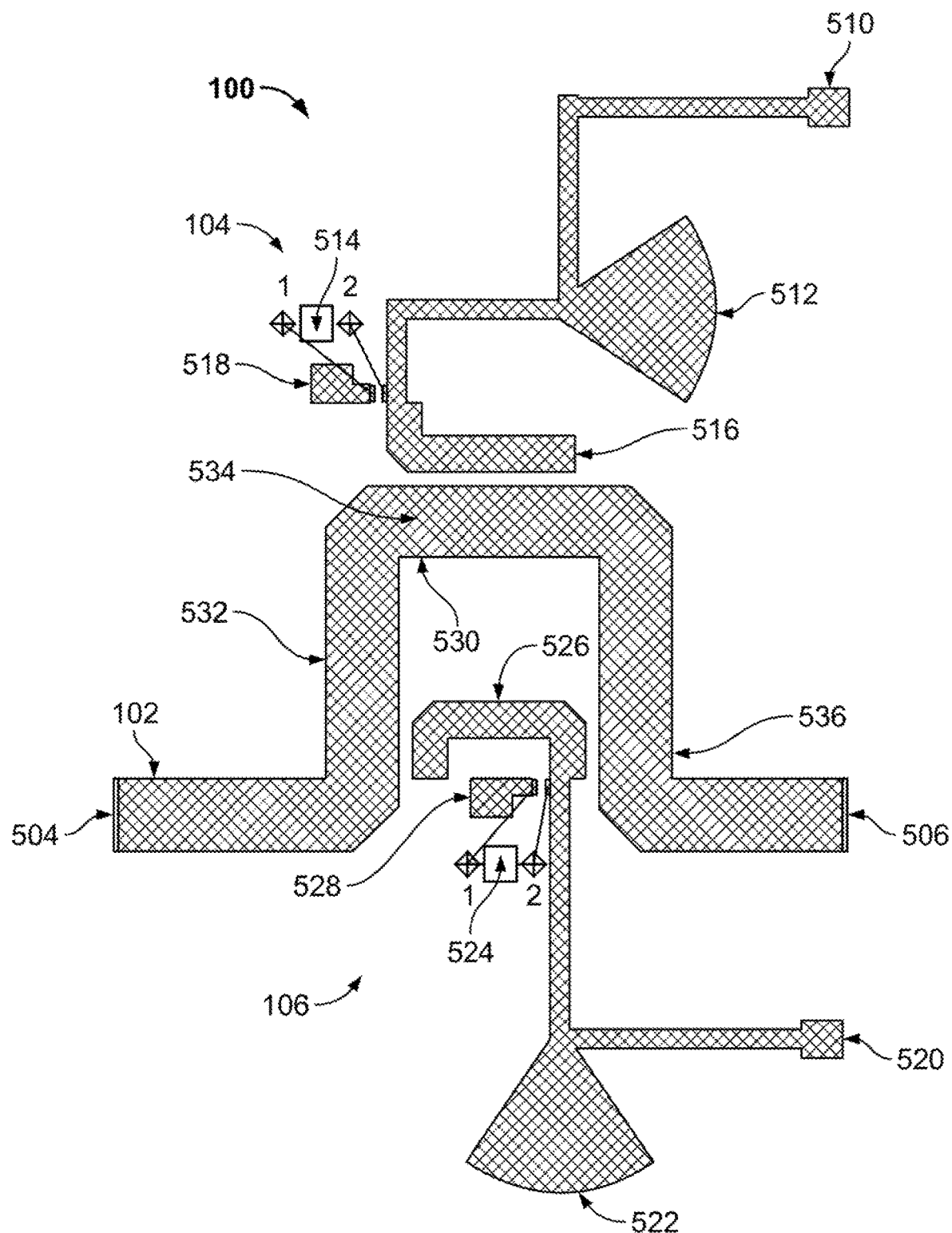
FIG. 5 illustrates elements of a tunable notch filter in accordance with aspects of the present invention.

FIG. 5 illustrates elements of an example embodiment of filter 100 in accordance with aspects of the present invention.

As shown in the figure, filter 100 includes an input port 504, an output port 506, a direct current voltage source 510, a radial stub 512, a tunable capacitor 514, a coupling line 516, a ground pad 518, a direct current voltage source 520, a radial stub 522, a tunable capacitor 524, a coupling line 526, and a ground pad 528.

Input port 504 is at one end of transmission line 102, whereas output port 506 is at the other end of transmission line 102. Transmission line 102 includes a U-shaped portion 530, having a first length 532, a second length 534 and a third length 536, wherein second length 534 is disposed between first length 532 and third length 536 to form a "U" shape. Further, U-shaped portion 530 has a length equal to $\lambda/2$, where $\lambda = f_0$.

Input port 504 and output port 506 may be any devices that allow input signal 108 and output signal 110 to enter and exit transmission line 102, respectively.

In this non-limiting example, tunable bandstop filter 104 is implemented as a transmission line equivalent circuit containing direct current voltage source 510, radial stub 512, tunable capacitor 514, coupling line 516, and ground pad 518, while tunable bandpass filter 106 is implemented as a transmission line equivalent circuit containing direct current voltage source 520, radial stub 522, tunable capacitor 524, coupling line 526, and ground pad 528.

Direct current voltage source 510 and direct current voltage source 520 may be any device or system that provides a specific DC bias voltage over a specified range. Direct current voltage source 510 and direct current voltage source 520 may be controlled by an operator, software, or other electrical component.

Ground pad 518 and ground pad 528 may be any device or system that provides an electrical ground.

Radial stub 512 and radial stub 522 may be any device or system that provides a broadly resonant radio frequency (RF) short circuit.

Tunable capacitor 514 and tunable capacitor 524 may be any device or system that can vary capacitance in response to a varying input parameter. Tunable capacitor 514 bridges coupling line 516 and ground pad 518. Tunable capacitor 524 bridges coupling line 526 and ground pad 528. In this non-limiting example, tunable capacitor 514 and tunable capacitor 524 are varactors.

Coupling line 516 and coupling line 526 may be any device or system that transfers RF energy from transmission line 102. In this non-limiting example, coupling line 516 transfers a portion of input signal 108 from transmission line 102 into tunable bandstop filter 104 and coupling line 526 transfers a portion of input signal 108 from transmission line 102 into tunable bandpass filter 106.

FIG. 5 illustrates elements of filter 100. Signals and operation of filter 100 will now be discussed with reference to FIG. 6.

Figure 6:
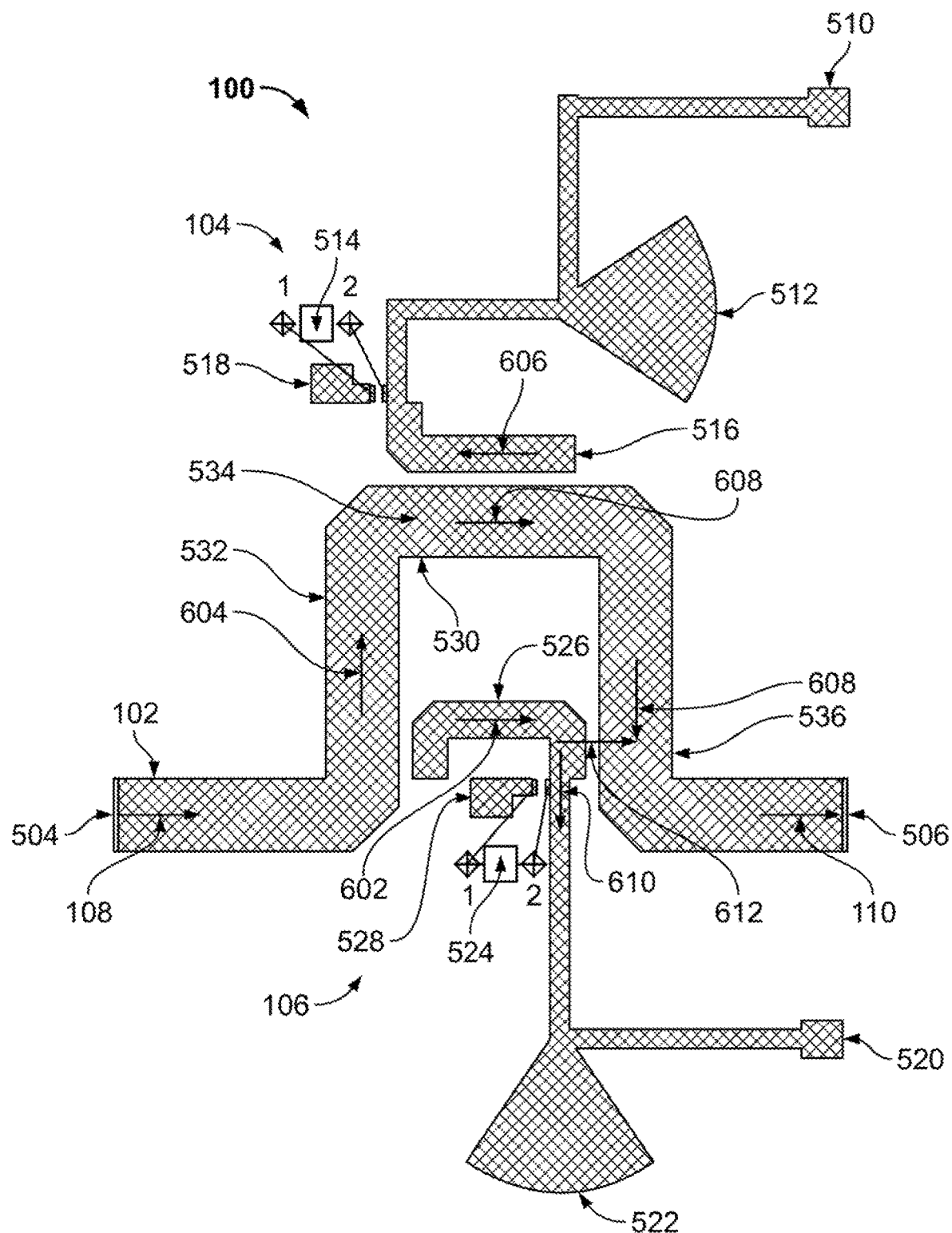
FIG. 6 illustrates signals of a tunable notch filter in accordance with aspects of the present invention.

FIG. 6 illustrates signals of filter 100 in accordance with aspects of the present invention.

As shown in the figure, filter 100 additionally includes input signal 108, output signal 110, input portion signal 604, a bandstop coupled signal 606, a bandstop filtered signal 608, a bandpass coupled signal 602, a grounded signal 610 and a bandpass filtered signal 612.

Input signal 108 enters input port and continues to U-shaped portion 530. At length 532, the input signal is split in a manner similar to that discussed above with reference to FIG. 2, wherein a portion will pass through a bandpass filter and a portion will pass through a bandstop filter.

Returning to FIG. 5, at first length 532 a portion of input signal 108 is coupled to coupling line 526 of tunable bandpass filter 106 as bandpass coupled signal 602. The remaining portion of input signal 108 continues through U-shaped portion 530 as input portion signal 604, which enters length 534.

A portion of input portion signal 604 is then coupled to coupling line 516 of tunable bandstop filter 104 as bandstop coupled signal 606. Bandstop coupled signal 606 is then sent to ground via ground pad 518. Bandstop coupled signal 606 has a frequency $f_0$ as tuned by capacitor 514, which is biased by a bias voltage provided by direct current voltage source 510. The remaining portion of the portion of input portion signal 604, that is not coupled to coupling line 516 continues through U-shaped portion 530 as bandstop filtered signal 608, which has a frequency response having a notch at frequency $f_0$.

Returning to tunable bandpass filter 106, a portion of bandpass coupled signal 602 that is outside the pass band centered on frequency $f_0$ is sent to ground via ground pad 528 as grounded signal 610. The remaining portion of bandpass coupled signal 602, the portion that is passed through tunable bandpass filter 106 as a passed portion, is coupled to length 536 of U-shaped portion 530 as bandpass filtered signal 612.

Therefore the output of tunable bandstop filter 104, which is bandstop filtered signal 608, combines with the output of tunable bandpass filter 106, which is bandpass filtered signal 612, to form output signal 110.

Transmission line 102, tunable bandstop filter 104, and tunable bandpass filter 106 are disposed such that bandstop filtered signal 608 and bandpass filtered signal 612 are 180° out of phase at the point that they are combined in transmission line 102.

In operation, input signal 108 enters filter 100. A portion of input signal 108 is affected by tunable bandstop filter 104 and another portion of input signal 108 is affected by tunable bandpass filter 106.

Tunable bandstop filter 104 and tunable bandpass filter 106 are set to the same center frequency by adjusting the bias voltages imposed on tunable capacitor 514 and on tunable capacitor 524 from direct current voltage source 510 and direct current voltage source 520, respectively tunable bandstop filter 104 and tunable bandpass filter 106 are further designed so that their bandpass amplitudes and notch depths can be identical. Bandstop filtered signal 608 and bandpass filtered signal 612 combine at 180° out of phase in transmission line 102 and cancel each other, which results in deep attenuation at the specified center frequency while minimizing reflections back through input port 504.

FIGS. 2-6 illustrate elements and operation of filter 100. Simulation results of filter 100 will now be discussed with reference to FIG. 7.

Figure 7:
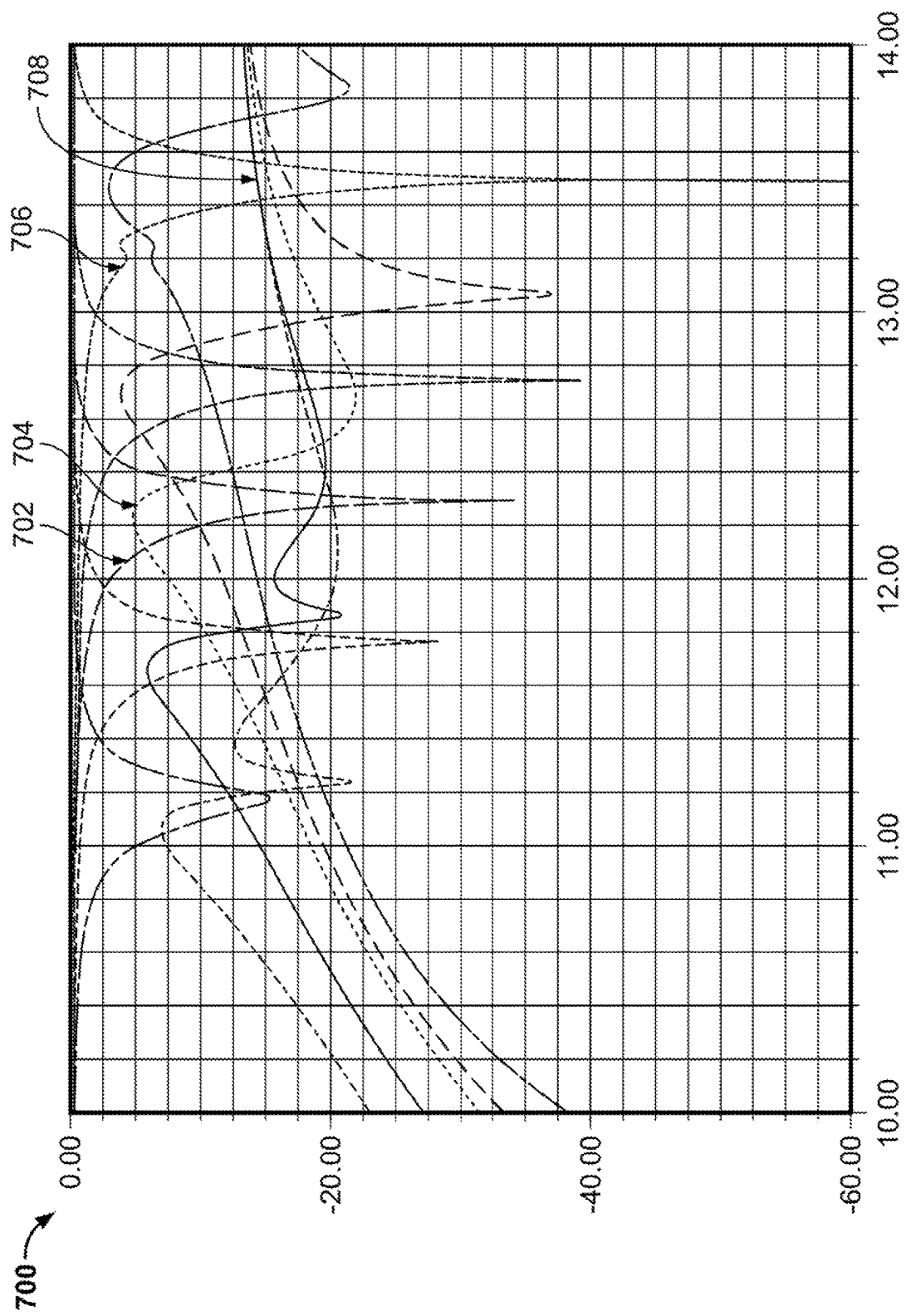
FIG. 7 illustrates a graph of results of a simulation of a tunable notch filter in accordance with aspects of the present invention.

FIG. 7 illustrates graph 700 of results of a simulation of filter 100 in accordance with aspects of the present invention.

As shown in the figure, graph 700 contains two sets of lines. One set of lines is the response of filter 100, measured at output port 506, for five different voltages imposed on tunable capacitor 514 and tunable capacitor 524. Another set of lines is the reflected signal as measured at input port 504 for the same five voltages imposed on tunable capacitor 514 and tunable capacitor 524.

In this non-limiting example, graph 700 illustrates response curves for filter 100 that is designed to operate around 12 GHz. Graph 700 shows that filter 100 can be tuned to notch frequencies ranging from 11.2 GHz to 13.5 GHz by varying the voltages applied to tunable capacitor 514 and to tunable capacitor 524.

Notch filter response curve 702 depicts the response of filter 100 with a notch center frequency of 12.3 GHz. At that center frequency, notch filter response curve 702 indicates an attenuation of about −35 dB. Input reflection curve 704 is the reflected signal corresponding to notch filter response curve 702. At 12.3 GHz, input reflection curve 704 indicates an absorption of about −5 dB.

Similarly, notch filter response curve 706 depicts the response of filter 100 with a notch center frequency of 13.5 GHz. At that center frequency, notch filter response curve 706 indicates an attenuation of about −60 dB. Input reflection curve 708 is the reflected signal corresponding to notch filter response curve 706. At 13.5 GHz, input reflection curve 708 indicates an absorption of about −15 dB.

A method of filtering a signal in accordance with aspects of the present invention will now be described with reference to FIG. 8.

Figure 8:
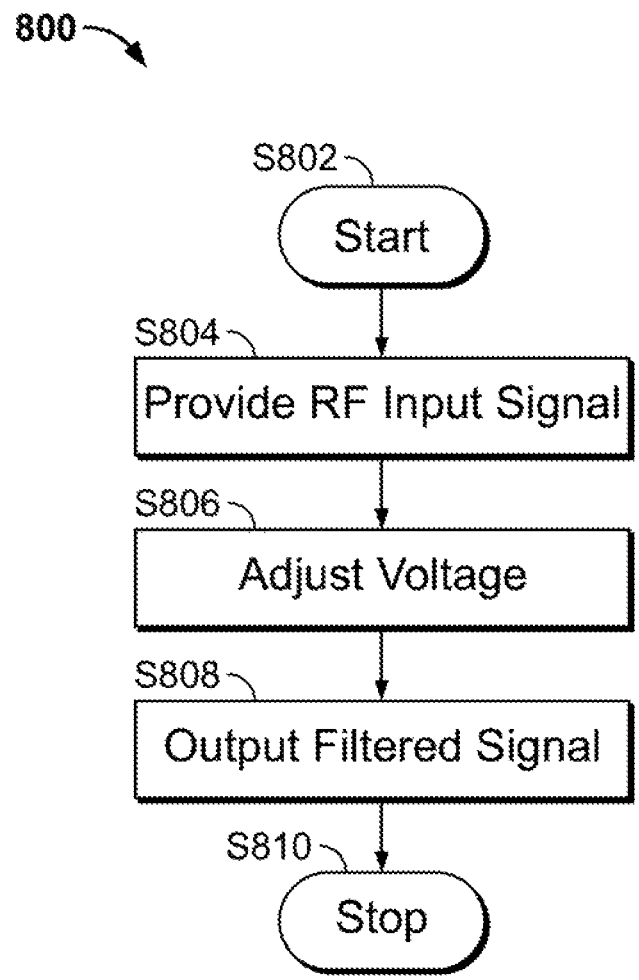
FIG. 8 illustrates a method of filtering a signal in accordance with aspects of the present invention.

FIG. 8 illustrates a method 800 of filtering a signal using a filter 100 in accordance with aspects of the present invention.

As shown in the figure, method 800 starts (S802) and an IR input signal is provided (S804). For example, returning to FIG. 6, input signal 108 is provided to transmission line 102.

Returning to FIG. 8, after the IR input signal is provided (S804), the voltage is adjusted (S806). For example, tunable capacitor 514 in tunable bandstop filter 104 is provided with a bias voltage via direct current voltage source 510 so as to tune tunable bandstop filter 104 to be centered on a predetermined frequency. Similarly, tunable capacitor 524 in tunable bandpass filter 106 is provided with a bias voltage via direct current voltage source 520 so as to tune tunable bandpass filter 106 to be centered on the predetermined frequency.

It should be noted that in method 800 of FIG. 8, the RF input signal is provided (S804) prior to the bias voltages being provided to adjust the tunable capacitors (S806). However, in other embodiments, the bias voltages being may be provided to adjust the tunable capacitors (S806)

prior to the RF input signal being provided (S804). Further, in yet other embodiments, the RF input signal may be provided (S804) at the same time that the bias voltages is provided (S806) to adjust the tunable capacitors (S806).

Returning to FIG. 8, after the voltage is adjusted (S806), the filtered signal is outputted (S808). For example, returning to FIG. 6, output signal 110 is provided to output port 506.

Returning to FIG. 8, after the filtered signal is outputted (S808), method 800 stops (S810).

In summary, wideband receivers are becoming more common in communications systems. Wideband receivers offer operational flexibility and agility but are also susceptible to being blocked by strong interferers. Notch filters can mitigate these blocking issues by precisely excising the narrowband interfering signals. However, prior-art filters often have compromises and are unable to simultaneously achieve all the characteristics desired in a notch filter.

The invention uses a tunable bandstop filter, a tunable bandpass filter, and phase cancellation techniques to achieve a notch filter that can operate at high frequencies, is tunable across a wide band, has a high Q factor, is absorptive, and is easy to manufacture.

The foregoing description of various embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A filter comprising:
    a transmission line having an input port, an output port and a length electrically connecting said input port to said output port, said transmission line being operable to receive an RF signal at said input port, said length having a first portion, a second portion and a third portion, said second portion being disposed between said first portion and said third portion;
    a tunable bandstop filter comprising a first direct current voltage source, a first coupling line and a first tunable capacitor, said first direct current voltage source being operable to provide a first adjustable voltage to said first tunable capacitor, said first tunable capacitor being operable to adjust a capacitance thereof based on the first adjustable voltage; and
    a tunable bandpass filter comprising a second direct current voltage source, a second coupling line and a second tunable capacitor, said second direct current voltage source being operable to provide a second adjustable voltage to said second tunable capacitor, said second tunable capacitor being operable to adjust a capacitance thereof based on the second adjustable voltage,
    wherein said tunable bandpass filter and said transmission line are arranged such that said second coupling line is operable to couple a first portion of the RF signal from said first portion of said length and such that said first portion of said length transmits a second portion of the RF signal to said second portion of said length,
    wherein said tunable bandstop filter and said transmission line are arranged such that said first coupling line is operable to couple, to ground, a third portion of the RF signal as provided by said first portion of said length at said second portion of said length and such that said second portion of said length transmits a fourth portion of the RF signal to said third portion of said length,
    wherein said tunable bandpass filter and said transmission line are further arranged such that said second coupling line is further operable to couple a passed portion of the first portion of the RF signal to said third portion of said length.

2. The filter of claim 1, where said transmission line, said tunable bandstop filter and tunable bandpass filter are further arranged such that the fourth portion of the RF signal is one hundred eighty degrees out of phase with the first portion of the RF signal coupled to said third portion of said length.

3. The filter of claim 2,
    wherein said first direct current voltage source is operable to provide a first bias voltage to said first tunable capacitor such that said tunable bandstop filter is operable to notch filter the second portion of the RF signal such that the fourth portion of the RF signal has frequency response having a notch centered around a predetermined frequency, and
    wherein said second direct current voltage source operable to provide a second bias voltage to said second tunable capacitor such that said tunable bandpass filter is operable to bandpass filter the second portion of the RF signal such that the passed portion of the first portion of the RF signal has frequency response having a pass band centered around the predetermined frequency.

4. The filter of claim 3, wherein said transmission line comprises a microstrip.

5. The filter of claim 1,
    wherein said first direct current voltage source is operable to provide a first bias voltage to said first tunable capacitor such that said tunable bandstop filter is operable to notch filter the second portion of the RF signal such that the fourth portion of the RF signal has frequency response having a notch centered around a predetermined frequency, and
    wherein said second direct current voltage source operable to provide a second bias voltage to said second tunable capacitor such that said tunable bandpass filter is operable to bandpass filter the second portion of the RF signal such that the passed portion of the first portion of the RF signal has frequency response having a pass band centered around the predetermined frequency.

6. The filter of claim 5, wherein said transmission line comprises a microstrip.

7. The filter of claim 1, wherein said transmission line comprises a microstrip.

8. A filtering method comprising:
    providing an RF input signal to a tunable filter having:
        a transmission line having an input port, an output port and a length electrically connecting the input port to the output port, the transmission line being operable to receive the RF signal at the input port, the length having a first portion, a second portion and a third portion, the second portion being disposed between the first portion and the third portion;
        a tunable bandstop filter comprising a first direct current voltage source, a first coupling line and a first tunable capacitor, the first direct current voltage source being operable to provide a first adjustable voltage to the first tunable capacitor, the first tunable capacitor being operable to adjust a capacitance thereof based on the first adjustable voltage; and a tunable bandpass filter comprising a second direct current voltage source, a second coupling line and a second tunable capacitor, the second direct current voltage source being operable to provide a second adjustable voltage to said second tunable capacitor, the second tunable capacitor being operable to adjust a capacitance thereof based on the second adjustable voltage; and outputting a filtered signal, wherein the tunable bandpass filter and the transmission line are arranged such that the second coupling line is operable to couple a first portion of the RF signal from the first portion of the length and such that the first portion of the length transmits a second portion of the RF signal to the second portion of the length, wherein the tunable bandstop filter and the transmission line are arranged such that the first coupling line is operable to couple, to ground, a third portion of the RF signal as provided by the first portion of the length line at the second portion of the length and such that the second portion of the length transmits a fourth portion of the RF signal to the third portion of the length, wherein the tunable bandpass filter and the transmission line are further arranged such that the second coupling line is further operable to couple a passed portion of the first portion of the RF signal to the third portion of the length.

9. The filtering method of claim 8, where the transmission line, the tunable bandstop filter and tunable bandpass filter are further arranged such that the fourth portion of the RF signal is one hundred eighty degrees out of phase with the first portion of the RF signal coupled to the third portion of the length.

10. The filtering method of claim 9, wherein the first direct current voltage source is operable to provide a first bias voltage to the first tunable capacitor such that the tunable bandstop filter is operable to notch filter the second portion of the RF signal such that the fourth portion of the RF signal has frequency response having a notch centered around a predetermined frequency, and wherein the second direct current voltage source operable to provide a second bias voltage to the second tunable capacitor such that the tunable bandpass filter is operable to bandpass filter the second portion of the RF signal such that the passed portion of the first portion of the RF signal has frequency response having a pass band centered around the predetermined frequency.

11. The filtering method of claim 10, wherein said transmission line comprises a microstrip.

12. The filtering method of claim 8, wherein the first direct current voltage source is operable to provide a first bias voltage to the first tunable capacitor such that the tunable bandstop filter is operable to notch filter the second portion of the RF signal such that the fourth portion of the RF signal has frequency response having a notch centered around a predetermined frequency, and wherein the second direct current voltage source operable to provide a second bias voltage to the second tunable capacitor such that the tunable bandpass filter is operable to bandpass filter the second portion of the RF signal such that the passed portion of the first portion of the RF signal has frequency response having a pass band centered around the predetermined frequency.

13. The filtering method of claim 12, wherein said transmission line comprises a microstrip.

14. The filtering method of claim 8, wherein said transmission line comprises a microstrip.

* * * * *